(12) United States Patent
Choi

(10) Patent No.: US 11,521,920 B2
(45) Date of Patent: Dec. 6, 2022

(54) PLURALITY OF POWER SEMICONDUCTOR CHIPS BETWEEN A SUBSTRATE AND LEADFRAME

(71) Applicant: JMJ Korea Co., Ltd., Bucheon-si (KR)

(72) Inventor: Yun Hwa Choi, Busan (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 0 days.

(21) Appl. No.: 17/382,346

(22) Filed: Jul. 22, 2021

(65) Prior Publication Data

US 2022/0223504 A1  Jul. 14, 2022

(30) Foreign Application Priority Data

Jan. 8, 2021 (KR) .................. 10-2021-0002732

(51) Int. Cl.
*H01L 23/495* (2006.01)
*H01L 23/34* (2006.01)
(Continued)

(52) U.S. Cl.
CPC .... *H01L 23/49575* (2013.01); *H01L 23/4952* (2013.01); *H01L 23/49503* (2013.01);
(Continued)

(58) Field of Classification Search
CPC ........... H01L 2924/181; H01L 23/4952; H01L 25/0655; H01L 25/072; H01L 23/49575;
(Continued)

(56) References Cited

U.S. PATENT DOCUMENTS

| 7,911,046 B2* | 3/2011 | Cablao ................... H01L 24/83 257/E21.705 |
| 8,872,318 B2* | 10/2014 | McElrea ................. H01L 23/13 257/276 |
| 9,449,900 B2* | 9/2016 | Sirinorakul ....... H01L 23/49582 |

FOREIGN PATENT DOCUMENTS

| JP | 6033215 B2 | 11/2016 |
| JP | 6139710 B2 | 5/2017 |

(Continued)

*Primary Examiner* — Alonzo Chambliss
(74) *Attorney, Agent, or Firm* — Park, Kim & Suh, LLC

(57) ABSTRACT

Provided is a semiconductor package including: at least two pads, a first substrate, at least two semiconductor devices, a second substrate, an electrical connection part, and a package housing, wherein the at least two pads are electrically or structurally separated from each other, the first substrate is formed of leads spaced apart from the pads, the at least two semiconductor devices are bonded on each of the pads, the second substrate is formed on and spaced apart from the upper parts of the semiconductor devices, is placed on and electrically connected to the at least one lead of the first substrate, and includes at least one penetrated opening unit on an area facing the at least one semiconductor device, the electrical connection part electrically connects the at least one semiconductor device with the second substrate, and the package housing covers the semiconductor devices and the electrical connection part. Accordingly, the semiconductor package has a multi die structure and is compact. Also, a shielding performance of electromagnetic interference (EMI) and a heat radiation performance are improved in the semiconductor package.

20 Claims, 14 Drawing Sheets

(51) Int. Cl.
- *H01L 23/48* (2006.01)
- *H01L 23/28* (2006.01)
- *H01L 21/00* (2006.01)
- *H05K 7/00* (2006.01)
- *H05K 7/18* (2006.01)
- *H01R 9/00* (2006.01)
- *H01L 23/00* (2006.01)
- *H01L 23/498* (2006.01)
- *H01L 25/065* (2006.01)
- *H01L 25/07* (2006.01)

(52) U.S. Cl.
CPC .. *H01L 23/49531* (2013.01); *H01L 23/49548* (2013.01); *H01L 23/49582* (2013.01); *H01L 23/49838* (2013.01); *H01L 24/97* (2013.01); *H01L 25/0655* (2013.01); *H01L 25/072* (2013.01); *H01L 24/14* (2013.01); *H01L 24/46* (2013.01); *H01L 24/81* (2013.01)

(58) Field of Classification Search
CPC ......... H01L 23/49503; H01L 23/49531; H01L 23/49582; H01L 23/49541; H01L 23/49548; H01L 23/49838; H01L 24/17; H01L 24/45; H01L 24/56; H01L 24/97; H01L 24/13; H01L 24/14; H01L 24/81; H01L 24/85

See application file for complete search history.

(56) References Cited

FOREIGN PATENT DOCUMENTS

| | | |
|---|---|---|
| KR | 10-2008-0061963 A | 7/2008 |
| KR | 10-1008534 B1 | 1/2011 |
| KR | 10-1208332 B1 | 12/2012 |
| KR | 10-1231792 B1 | 2/2013 |
| KR | 10-2014-0077486 A | 6/2014 |
| KR | 10-1434039 B1 | 8/2014 |
| KR | 10-1505552 B1 | 3/2015 |
| KR | 10-2021-0001495 A | 1/2021 |

* cited by examiner

PLURALITY OF POWER SEMICONDUCTOR CHIPS BETWEEN A SUBSTRATE AND LEADFRAME

CROSS-REFERENCE TO RELATED PATENT APPLICATION

This application claims the benefit of Korean Patent Application No. 10-2021-0002732, filed on Jan. 8, 2021, in the Korean Intellectual Property Office, the disclosure of which is incorporated herein in its entirety by reference.

BACKGROUND OF THE INVENTION

1. Field of the Invention

The present invention relates to a semiconductor package having a multi die stacked structure which applies an electrical signal to a semiconductor device through a penetrated opening unit, is formed to be compact that is appropriate for a small-sized semiconductor package, adjusts a size of the penetrated opening unit which faces the semiconductor device, shows an excellent shielding performance of electromagnetic interference (EMI), and improves a heat radiation performance.

2. Description of the Related Art

In general, a semiconductor package is manufactured by installing at least one semiconductor chip on a lead frame or a printed circuit board and sealing the semiconductor chips using a sealing member and then, is used after being installed on a mother board or a printed circuit board.

On the other hand, since electronic devices become faster, have large capacity, and are highly integrated, power devices are required to be smaller, light-weighted, and multifunctional.

Accordingly, a power module package, where a plurality of power semiconductor chips and control semiconductor chips is integrated on one semiconductor chip, is suggested.

In this regard, Korean Patent Registration No. 10-1208332 discloses a clip structure for a semiconductor package and the semiconductor package using the clip structure which include a first package 100', a second package 200', and a connecting member 310' for electrically connecting the first package 100' to the second package 200'. Here, the second package 200' is installed on the connecting member 310' and the connecting member 310' is electrically connected to an upper conductive layer 113' of a packaging substrate or semiconductor chips 120' by using an Al or Au wire 343'. Also, first leads 341' are electrically connected to each other through the upper conductive layer 113' of the packaging substrate and a solder and second leads 345' are electrically connected to the connecting member 310' through the solder. Accordingly, a small-sized package may be installed within a power module package.

The first package and the second package are stacked in a multi die structure, however, a vertically stacked structure for wire connection may not be formed. Accordingly, there are limitations to form a stacked structure to be compact and smaller. In addition, structural stability and thermal stability may not be sufficiently secured due to a structural limit which cools heat generated from semiconductor chips.

SUMMARY OF THE INVENTION

The present invention provides a semiconductor package having a multi die stacked structure which applies an electrical signal to a semiconductor device through a penetrated opening unit, is formed to be compact that is appropriate for a small-sized semiconductor package, adjusts a size of the penetrated opening unit which faces the semiconductor device, shows an excellent performance of shielding electromagnetic interference (EMI), and improves a heat radiation performance.

According to an aspect of the present invention, there is provided a semiconductor package including: a first substrate comprising at least two pads electrically or structurally separated from each other and at least two leads spaced apart from the pads; at least two semiconductor devices bonded on each of the pads; a second substrate formed on and spaced apart from the upper parts of the semiconductor devices, placed on and electrically connected to the at least one lead of the first substrate, and including at least one penetrated opening unit on an area facing the at least one semiconductor device; electrical connection parts electrically connecting the at least one semiconductor device with the second substrate; and a package housing covering the semiconductor devices and the electrical connection part.

The first substrate may be a lead frame formed of a metal and the metal may include 50% or more of Cu or 40% or more of Al.

The at least one pad may include at least one insulating layer and a metal layer pad where the semiconductor device is bonded on the insulating layer, and the at least one lead may include a connection lead part electrically connected with the second substrate and a terminal lead part extended from the connection lead part.

The semiconductor devices may be formed of Gallium Nitride (GaN), Silicon (Si), or Silicon Carbide (SiC).

The at least one semiconductor device may include at least four terminal pads formed thereon where the electrical connection parts are bonded.

The at least one semiconductor device may be a diode, a Metal Oxide Semiconductor Field Effect Transistor (MOSFET), an Insulated Gate Bipolar Transistor (IGBT), or a thyristor.

The at least two semiconductor devices may be formed of one or more devices each having an IC characteristic and a transistor characteristic.

The second substrate may include at least one insulating layer.

The second substrate may be a printed circuit board (PCB), a Direct Bonded Copper (DBC) substrate including a ceramic-type insulating layer, an Active Metal Brazing (AMB) substrate, or a Thick Printed Copper (TPC) substrate.

At least one upper metal pattern may be formed on the uppermost part of the second substrate, at least one lower metal pattern may be formed on the lowest part of the second substrate, and the upper metal pattern and the lower metal pattern may be electrically connected to each other.

The diameter of the penetrated opening unit may be 0.2 mm to 20.0 mm and the side of the penetrated opening unit may be covered with a non-conductive material.

Terminal pads on the at least one semiconductor device and the upper metal pattern on the second substrate may be electrically connected to each other by the electrical connection part which pass the penetrated opening unit.

The electrical connection part may be a bonding wire and the bonding wire may include 50% or more of any one of Cu, Au, and Al.

The most outer surface of the upper metal pattern on the second substrate may entirely or partially include 50% or more of Au, Ag, or Cu.

The terminal pads on the at least one semiconductor device and the lower metal pattern on the second substrate formed outside of the penetrated opening unit may be electrically connected to each other by the electrical connection part.

The electrical connection part formed on the semiconductor device may include 50% or more of Au, Ag, Cu or a solder material and may electrically connect a signal connection terminal, which is bumped, with the lower metal pattern on the second substrate.

The at least one semiconductor device may be electrically connected with the second substrate by a solder material containing 50% or more of Sn or Pb.

A size of the penetrated opening unit may be the same as or larger than a size of the semiconductor device.

A size of the penetrated opening unit may be smaller than a size of the semiconductor device.

The penetrated opening unit may be formed to correspond to the shape of the semiconductor device, and a length of at least one surface of the penetrated opening unit may be greater than a length of at least one surface of the pad of the first substrate, on which the semiconductor devices are bonded.

The penetrated opening unit may be formed to correspond to the shape of the semiconductor device, and a length of at least one surface of the penetrated opening unit may be shorter than a length of at least one surface of the pad of the first substrate, on which the semiconductor devices are bonded.

The upper metal pattern or the lower metal pattern on the second substrate may be electrically connected with the at least one lead of the first substrate by using a conductive adhesive.

The connection lead part of the first substrate electrically connected with the second substrate may be formed to be placed above the terminal lead part of the first substrate exposed to the outside of the package housing.

The lower surface of the first substrate may be partially or entirely exposed to the surface of the package housing.

A part of the lower surface of the first substrate may be the lower surface of the at least one pad of the first substrate and 50% or more of the entire lower surface of the pads may be exposed to the surface of the package housing.

The lower surface of the terminal lead part of the first substrate may be partially or entirely exposed to the surface of the package housing.

The package housing may be formed of an epoxy molding compound (EMC). 90% or more of the EMC may be filled in an inner space of the penetrated opening unit.

BRIEF DESCRIPTION OF THE DRAWINGS

The above and other features and advantages of the present invention will become more apparent by describing in detail exemplary embodiments thereof with reference to the attached drawings in which:

FIGS. 10A, 10B, and 100 respectively illustrate electrical connections between a semiconductor device and the second substrate in the semiconductor package according to an embodiment of the present invention.

DETAILED DESCRIPTION OF THE INVENTION

Figure 1:
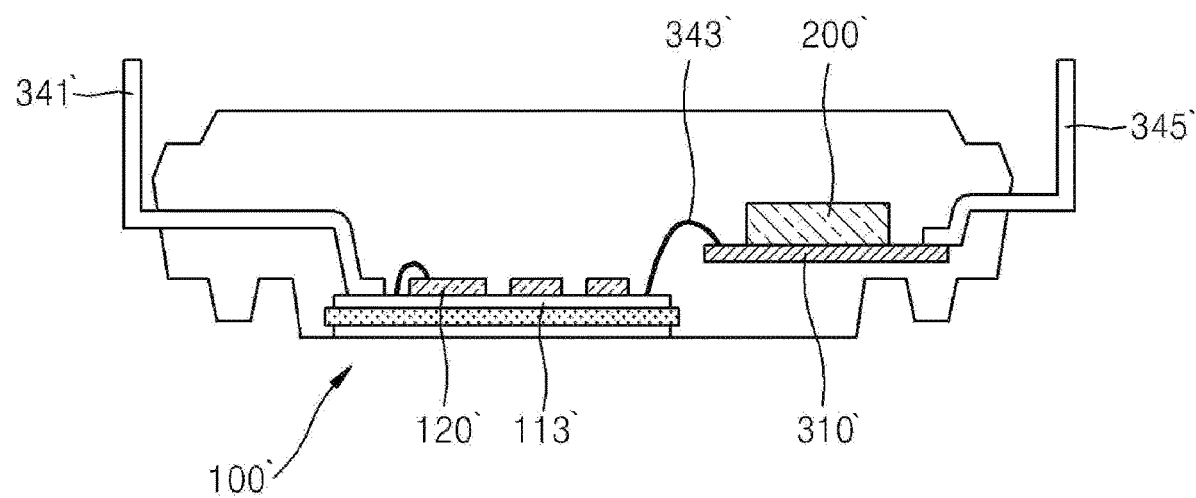
FIG. 1 illustrates a conventional semiconductor package.

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

A semiconductor package according to an embodiment of the present invention includes at least two pads 111, a first substrate 110, at least two semiconductor devices 120, a second substrate 130, an electrical connection part 140, and a package housing 150, wherein the at least two pads 111 are electrically or structurally separated from each other, the first substrate 110 is formed of leads spaced apart from the pads 111, the at least two semiconductor devices 120 are bonded on each of the pads 111, the second substrate 130 is formed on and spaced apart from the upper parts of the semiconductor devices 120, is placed on and electrically connected to the at least one lead of the first substrate 110, and includes at least one penetrated opening unit 131 on an area facing the at least one semiconductor device 120, the electrical connection part 140 electrically connects the at least one semiconductor device 120 with the second substrate 130, and the package housing 150 covers the semiconductor devices 120 and the electrical connection part 140. Accordingly, the semiconductor package may be formed to be compact having a multi die structure, and a shielding performance of electromagnetic interference (EMI) and a heat radiation performance may be improved.

Figure 2A:
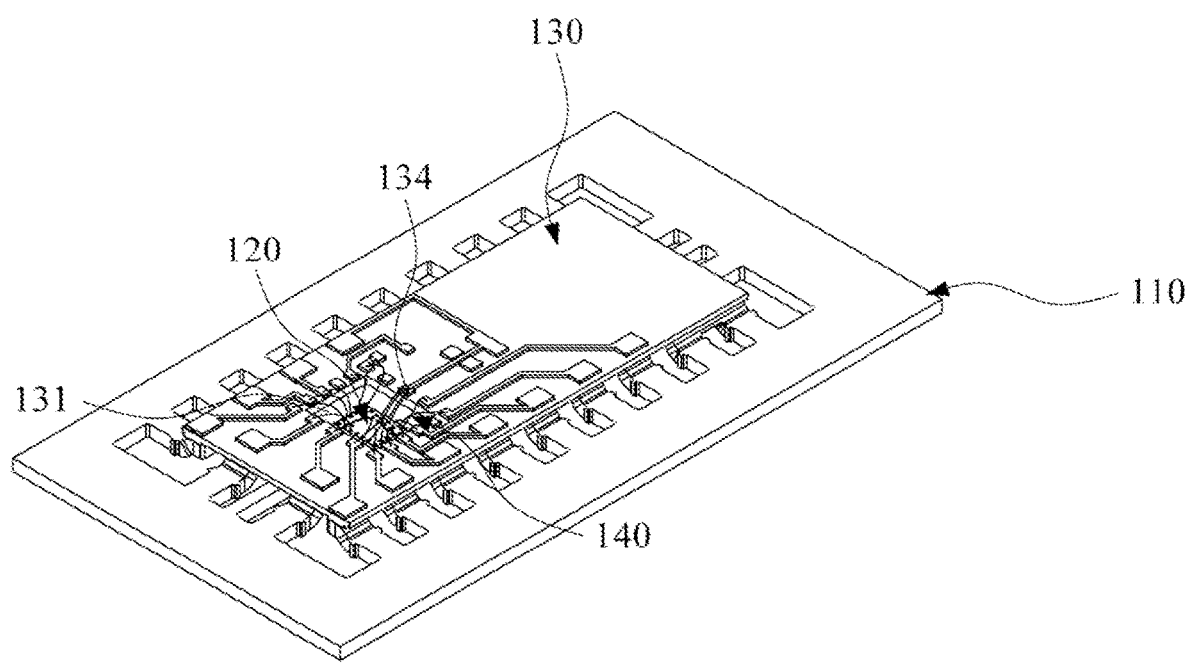
FIGS. 2A and 2B respectively illustrate perspective views of a first example and a second example of a semiconductor package according to an embodiment of the present invention.
Figure 2B:
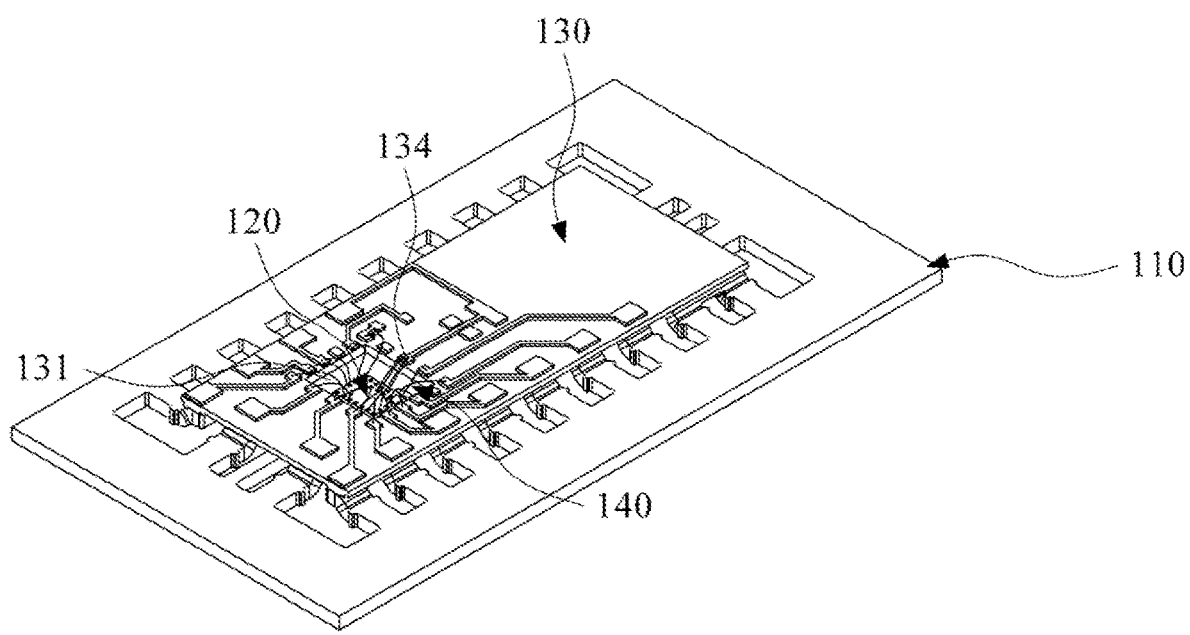

Hereinafter, the semiconductor package described above will be described in more detail with reference to FIGS. 2A through 100.

Figure 5A:
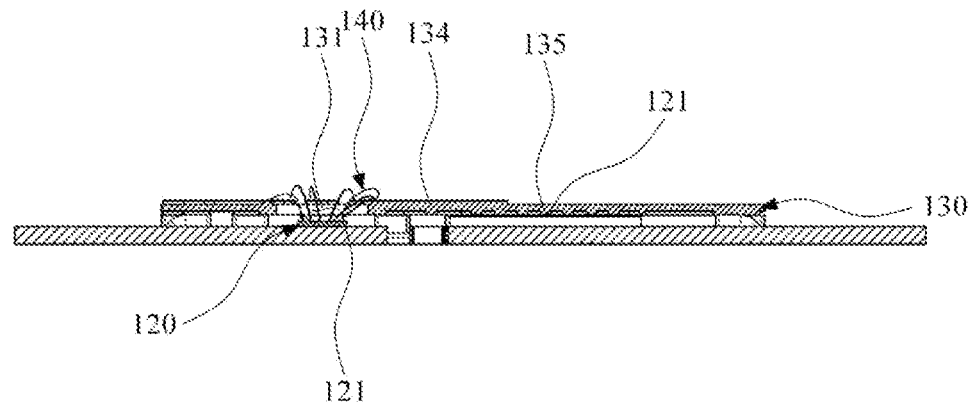
FIGS. 5A to 5C and FIGS. 6A to 6C respectively illustrate cross-sectional views of the semiconductor package of FIGS. 2A and 2B.
Figure 5B:
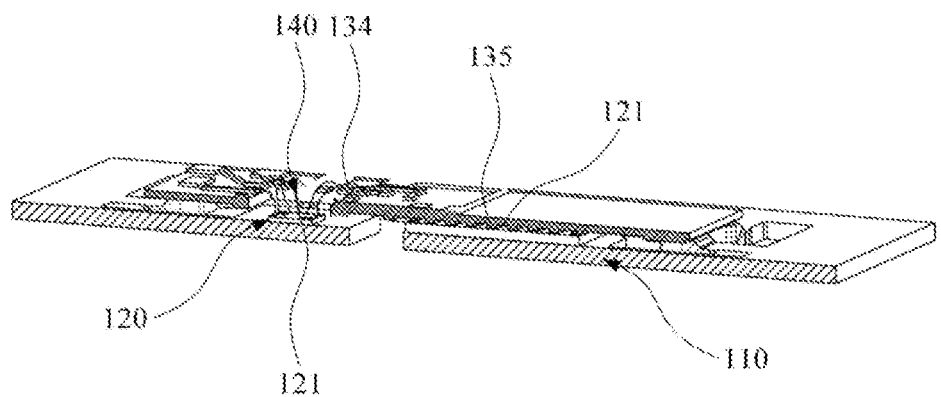
Figure 5C:
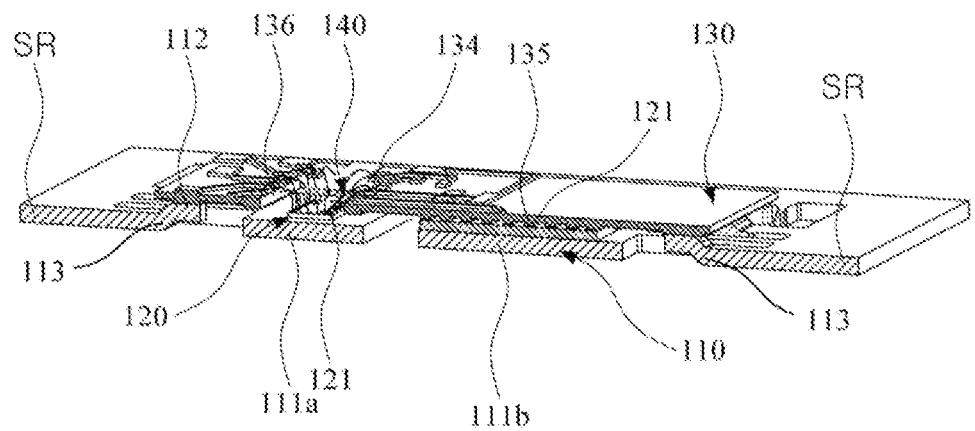
Figure 6A:
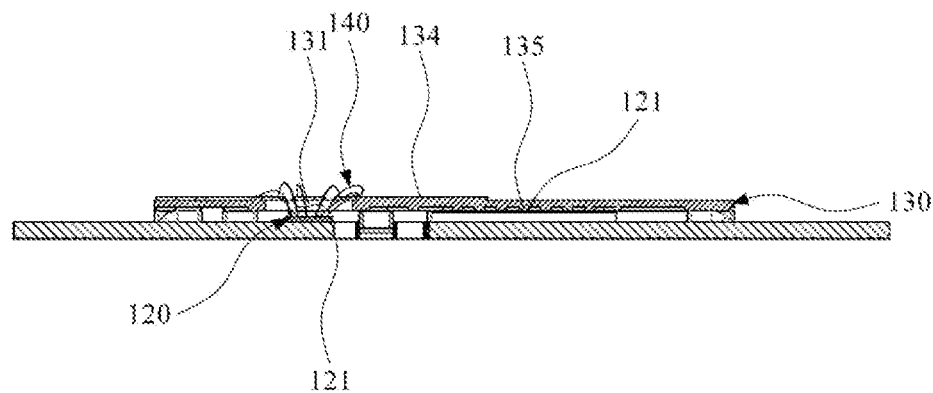
Figure 6B:
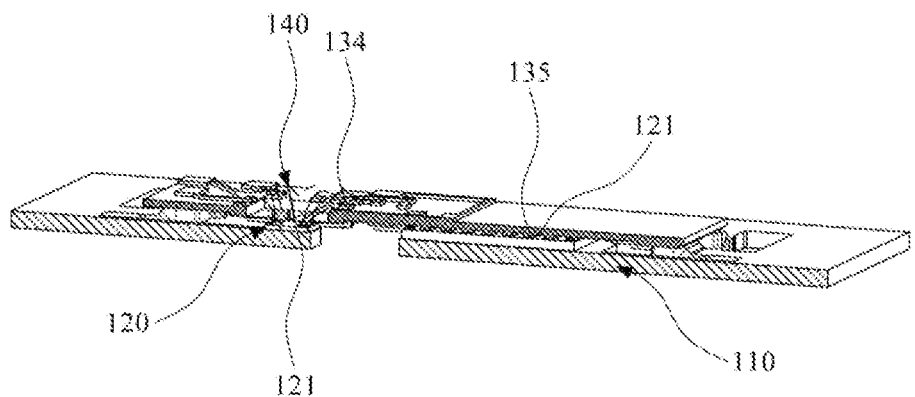
Figure 6C:
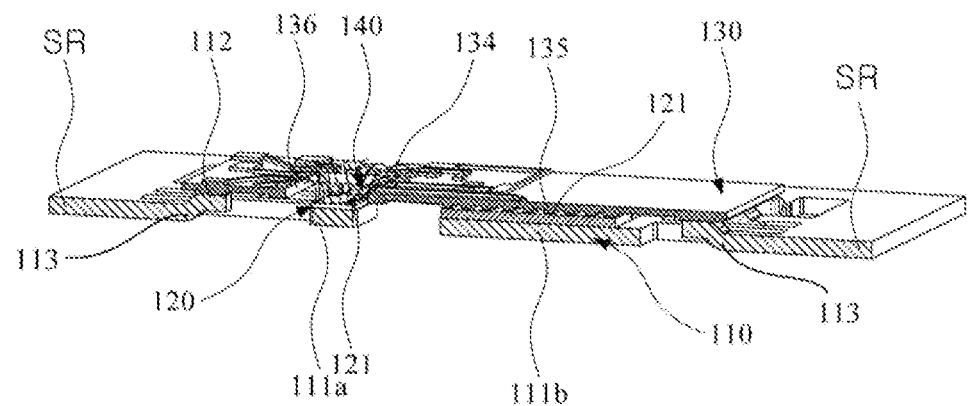
Figure 7:
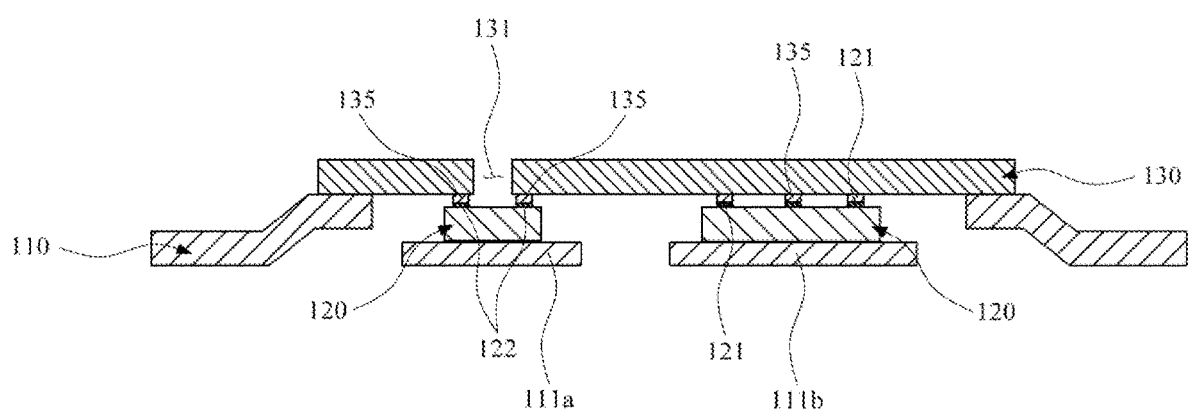
FIG. 7 is a cross-sectional view schematically illustrating a third example of the semiconductor package of FIGS. 2A and 2B.
Figure 8A:
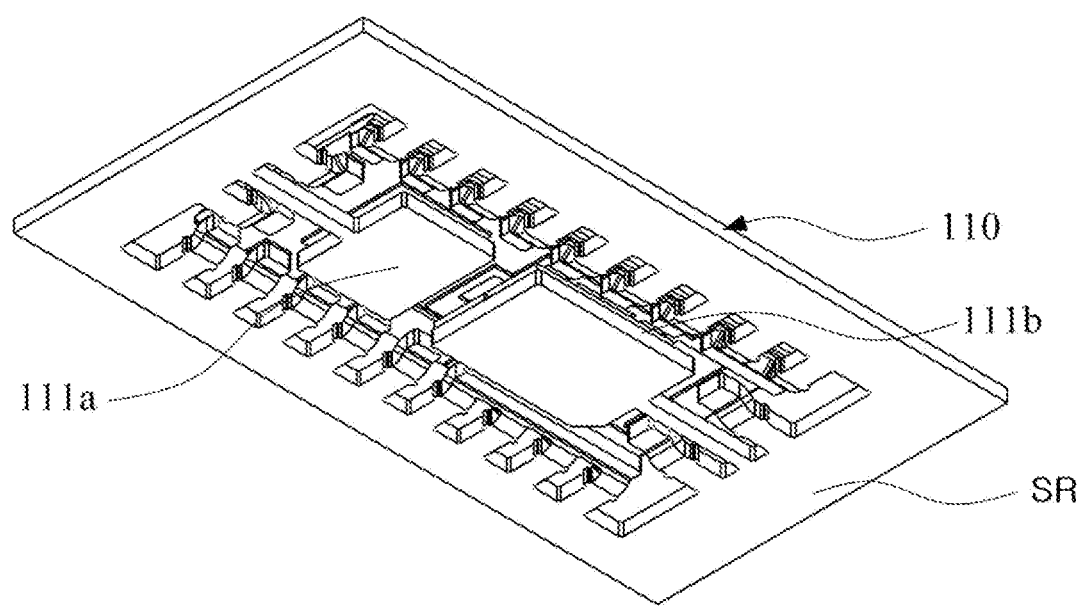
FIGS. 8A and 8B respectively illustrate bottom structures of the semiconductor package of FIGS. 2A and 2B.
Figure 8B:
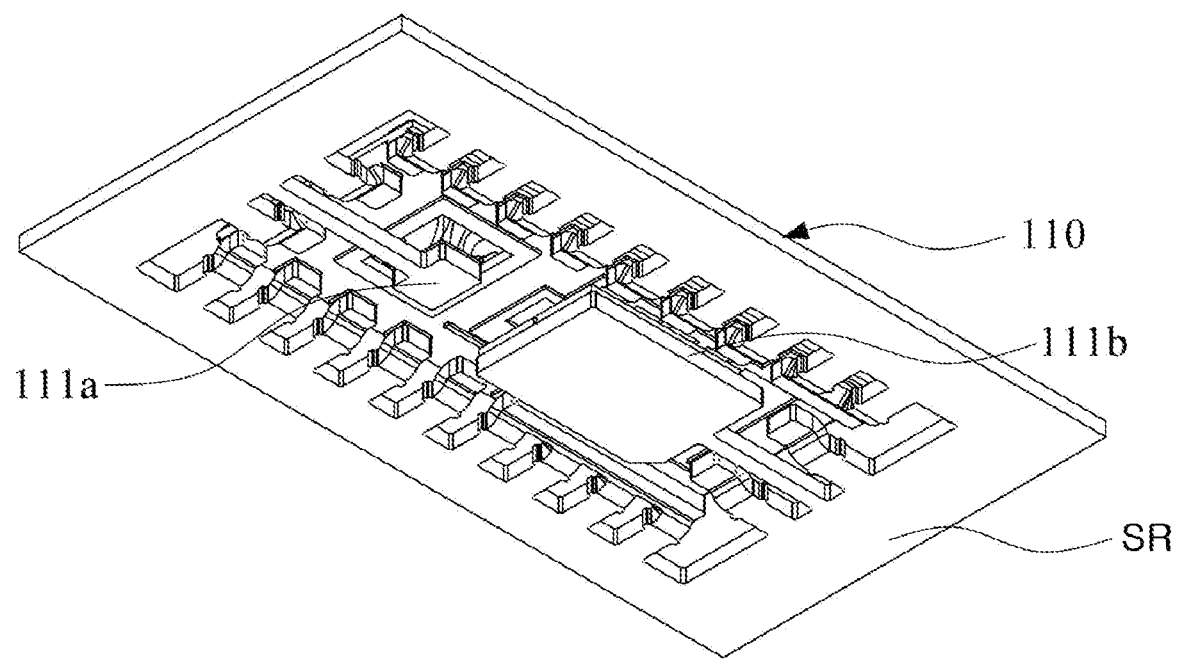

For reference, FIG. 2A, FIG. 3, FIGS. 5A to 5C, FIG. 8A, FIG. 9, and FIG. 10A illustrate a first example of a semiconductor package, FIG. 2B, FIG. 4, FIGS. 6A to 6C, FIG. 8B, FIG. 9, FIG. 10B illustrate a second example of a semiconductor package, and FIG. 7 and FIG. 100 illustrate a third example of a semiconductor package.

Firstly, as illustrated in FIGS. 2A through 4, the first substrate 110 may include at least two pads 111 electrically or structurally separated from each other so as for the at least two semiconductor devices 120 to be bonded on each of the pads 111, and at least two leads spaced apart from the pads 111.

According to an embodiment of the present invention, the first substrate 110 may be a lead frame (L/F) formed of a metal, wherein the metal may include 50% or more of Cu or 40% or more of Al and thereby, excellent electrical conductivity and thermal conductivity may be realized.

According to another embodiment of the present invention, the first substrate 110 may include the pad 111, a connection lead part 112, and leads, wherein the pad 111 includes at least one insulating layer (not illustrated) and a metal layer pad where the semiconductor device 120 is bonded on the insulating layer, the connection lead part 112 is electrically connected with the second substrate 130, and the leads include a terminal lead part 113 extended from the connection lead part 112 and partially exposed to the outside of the package housing 150. More specifically, the pads 111 may have a structure (not illustrated) including at least one insulating layer and metal layers (metal patterns) included in the upper part, the lower part, or all of the upper and lower parts of the insulating layer. Also, the leads may be formed of a metal or may have a structure (not illustrated) including at least one insulating layer and metal layers (metal patterns) included in the upper part, the lower part, or all of the upper and lower parts of the insulating layer.

Figure 3:
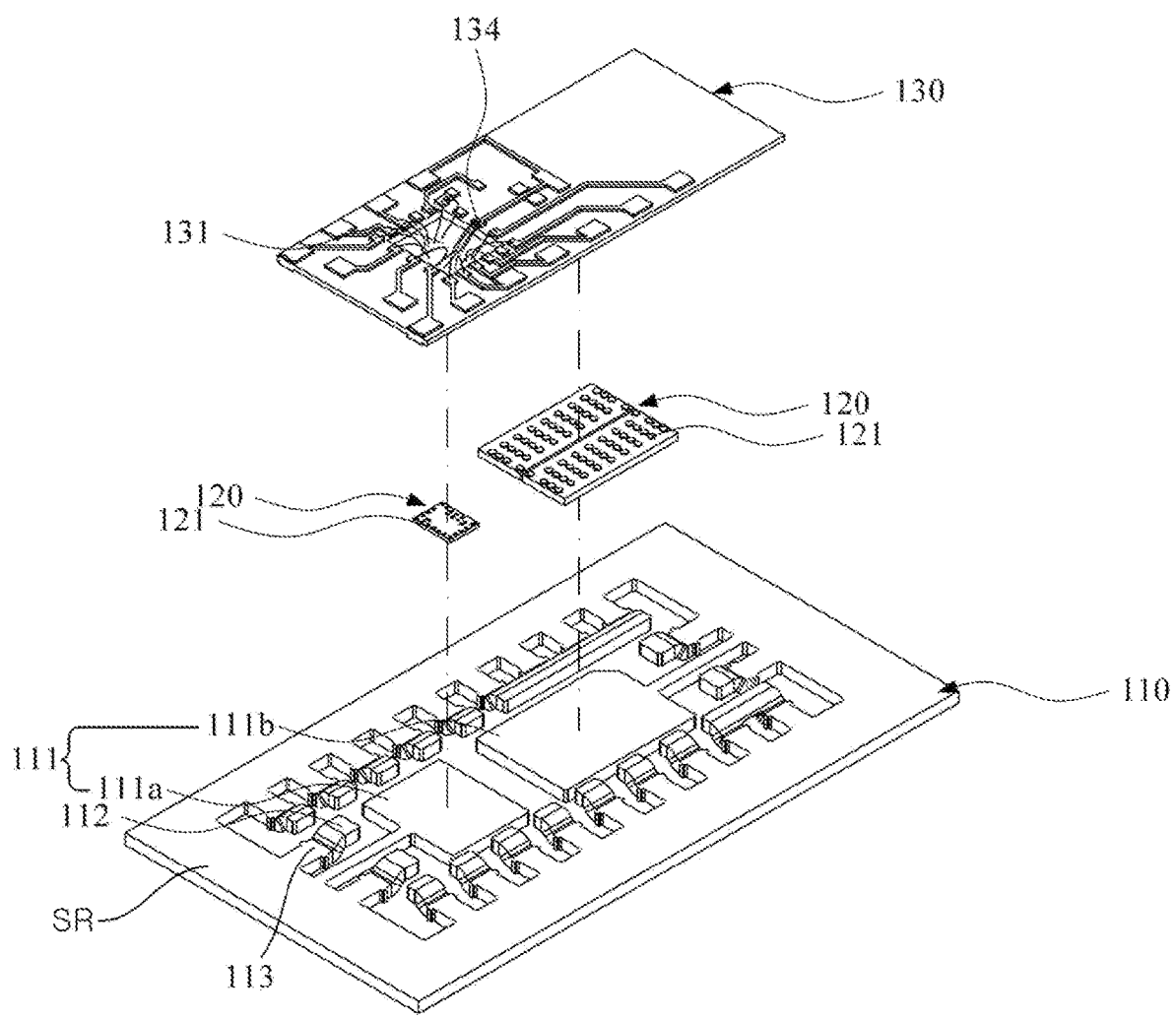
FIG. 3 and FIG. 4 respectively illustrate exploded perspective views of the semiconductor package of FIGS. 2A and 2B.
Figure 4:
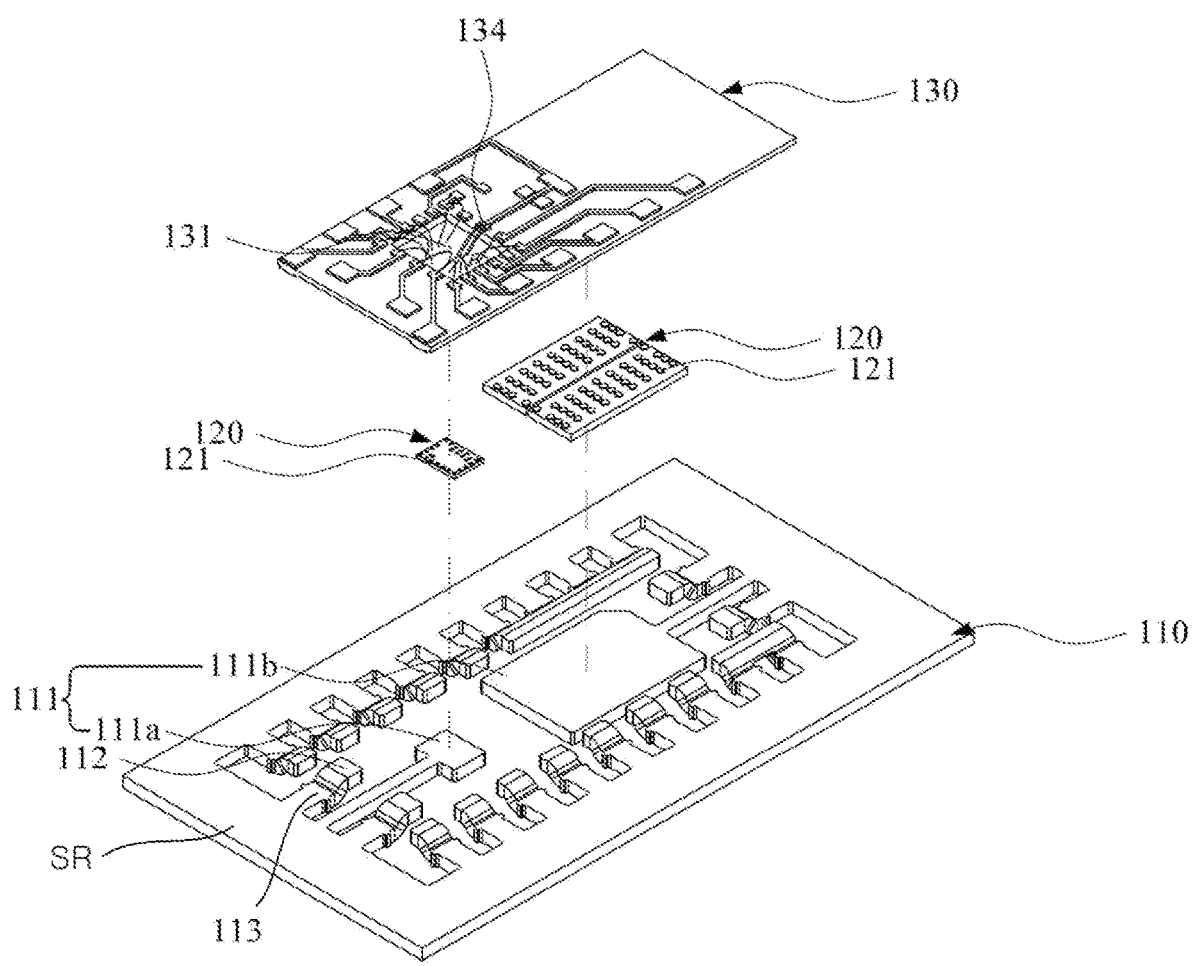

Here, referring to FIGS. 3 and 4, the pad 111 may be structurally separated into a first pad 111a and a second pad 111b and the at least one semiconductor device 120 may be formed on each of the pads 111a and 111b. The leads described above may be formed of the connection lead part 112 and the terminal lead part 113.

Here, a side rail part (SR) extended from the terminal lead part 113 is a dummy connection part which is to be removed by a cutting process after forming of the package housing 150.

Next, the semiconductor devices 120 may be two or more which are bonded on each of the pads 111a and 111b and may be formed of Gallium nitride (GaN), Silicon (Si), or Silicon Carbide (SiC). The at least one semiconductor device 120 may be a diode, a metal oxide semiconductor field effect transistor (MOSFET), an insulated gate bipolar transistor (IGBT), or a thyristor.

In addition, the semiconductor device 120 may be formed of one or more devices each having an IC characteristic and a transistor characteristic. For example, an IC device may be bonded to the first pad 111a and a transistor device may be bonded to the second pad 111b.

As illustrated in FIGS. 2A through 4, a plurality of, for example, at least four terminal pads 121 may be formed on the at least one semiconductor device 120, wherein the terminal pads 121 enable each of the electrical connection parts 140 bonded on the at least one semiconductor device 120 to electrically connect with the second substrate 130.

Next, as illustrated in FIGS. 2A through 4, the second substrate 130 is spaced apart from the upper part of the semiconductor device 120, is placed on the connection lead part 112 of the at least one lead of the first substrate 110, and thereby, is electrically connected with the first substrate 110. Also, one or more penetrated opening units 131 are formed on areas facing the at least one semiconductor device 120.

Accordingly, the first substrate 110 and the second substrate 130 are formed to have a stacked structure so that an electrical signal may be applied to the semiconductor devices 120 from the second substrate 130 by the electrical connection parts 140 which pass the penetrated opening units 131. Also, the first substrate 110 and the second substrate 130 are in a multi die structure and may be formed to be compact that is appropriate for, in particular, a small-sized semiconductor package.

Figure 9:
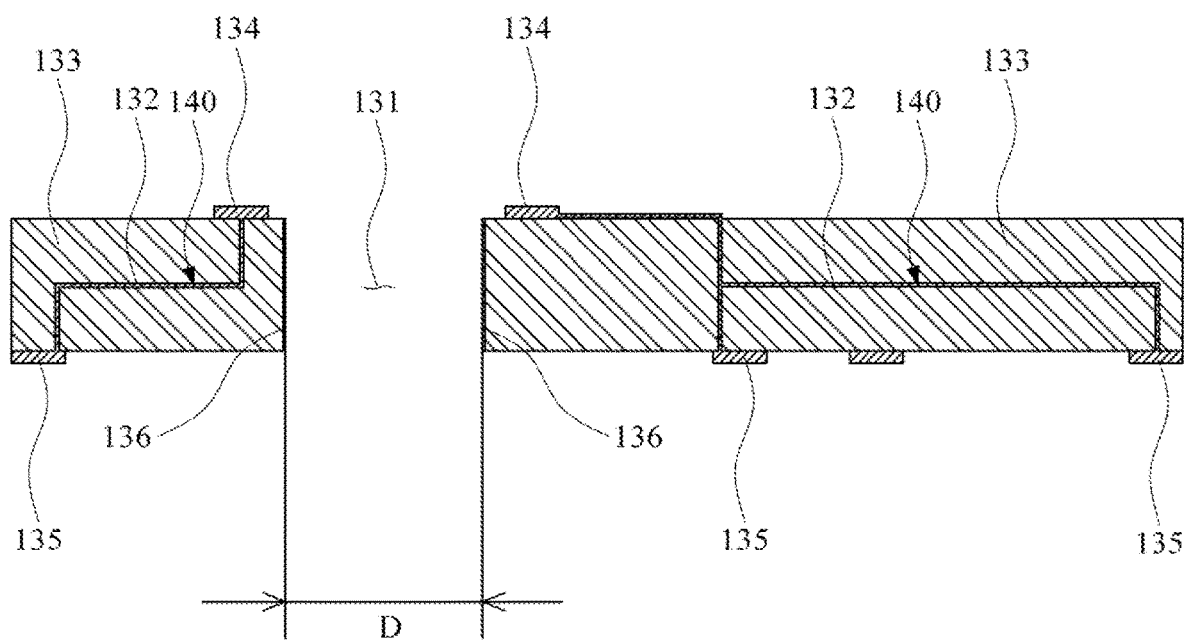
FIG. 9 is a cross-sectional view illustrating a second substrate of the semiconductor package of FIGS. 2A and 2B.

In addition, referring to FIG. 9, the second substrate 130 may include at least one insulating layer 133. For example, the second substrate 130 may be a printed circuit board (PCB), a Direct Bonded Copper (DBC) substrate including a ceramic-type insulating layer, an Active Metal Brazing (AMB) substrate, or a Thick Printed Copper (TPC) substrate.

At least one upper metal pattern 134 formed on the uppermost part of the second substrate 130 and at least one lower metal pattern 135 formed on the lowest part of the second substrate 130, wherein the second substrate 130 includes the insulating layers 133, may be electrically connected to each other.

Here, referring to FIGS. 5C and 6C, the terminal pads 121 formed on the at least one semiconductor device 120 and the upper metal patterns 134 of the second substrate 130 are electrically connected to each other by the electrical connection parts 140 which pass the penetrated opening units 131 and thereby, an electrical signal may be applied to the semiconductor devices 120 from the second substrate 130.

Also, referring to FIGS. 5C, 6C, and 9, the diameter of the penetrated opening unit 131 is 0.2 mm to 20.0 mm and the side of the penetrated opening unit 131 (for example, the inner side of the penetrated opening unit 131 in FIG. 9) is covered with a non-conductive material 136. Accordingly, an electrical short occurring due to an unexpected contact between the electrical connection part 140, which passes the penetrated opening unit 131, and the penetrated opening unit 131 may be prevented.

In addition, as illustrated in FIGS. 5C and 6C, the upper metal pattern 134 or the lower metal pattern 135 of the second substrate 130 is electrically connected with the connection lead part 112 of the first substrate 110 by using a conductive adhesive (not illustrated), and the connection lead part 112 of the first substrate 110 which is electrically connected with the second substrate 130 is formed to be placed above the terminal lead part 113 of the first substrate 110 exposed to the outside of the package housing 150.

That is, the connection lead part 112 of the first substrate 110 is formed to have a down set structure, which is extended and bent upward from the terminal lead part 113, and thereby, is electrically connected with the upper metal pattern 134 or the lower metal pattern 135 of the second substrate 130. Also, the second substrate 130 is spaced apart from the semiconductor device 120 and thus, may be stacked to electrically connect with the first substrate 110.

Next, the electrical connection parts 140 electrically connect the at least one semiconductor device 120 with the second substrate 130 through the penetrated opening units 131 or via holes 132.

For example, referring to FIGS. 5A to 5C, 6A to 6C, 10A, and 10B, in the semiconductor package of the first and second examples, the electrical connection parts 140 may be bonding wires, wherein the bonding wires electrically connect the terminal pads 121 of the semiconductor devices 120 on the first pad 111a with the upper metal pattern 134 of the second substrate 130 through the penetrated opening units 131. Accordingly, the first substrate 110 and the second substrate 130 may have a stacked structure and electrical connection may be realized between the semiconductor devices 120 on the first substrate 110 and the second substrate 130 through the penetrated opening units 131. Therefore, the first substrate 110 and the second substrate 130 may have a compact multi die structure without exposure or extension toward the outside.

Here, the bonding wires may include 50% or more of any one of Cu, Au, and Al and the most outer surface of the upper metal pattern 134 of the second substrate 130 may partially include 50% or more of Au, Ag, or Cu. Accordingly, excellent electric conductivity and thermal conductivity may be realized.

As described above, the electrical connection parts 140 may be bonding wires. However, the present invention is limited thereto and the electrical connection parts 140 may be metal clips or metal clips formed of multi materials so as to electrically connect the semiconductor devices 120 with the second substrate 130 (not illustrated).

The at least one semiconductor device 120 may be electrically connected with the second substrate 130 through a solder material (not illustrated) containing 50% or more of Sn or Pb. That is, the terminal pads 121 of the semiconductor devices 120 on the second pad 111*b* and the lower metal pattern 135 of the second substrate 130 are electrically connected to each other by the solder material, and an electrical signal may be applied from the upper metal pattern 134, which is electrically connected with the lower metal pattern 135 through the electrical connection parts 140 formed on the via holes 132 (refer to FIG. 9), to the semiconductor devices 120 on the second pad 111*b*.

Also, referring to FIG. 7, in the semiconductor package of the third example, the terminal pads 121 of the at least one semiconductor device 120 on the first pad 111*a* and the lower metal pattern 135 of the second substrate 130 formed outside of the penetrated opening unit 131 (for example, outside closed to an area where the penetrated opening unit 131 is formed) are electrically connected to each other by the electrical connection parts 140 and thereby, an electrical signal may be applied to the semiconductor devices 120 from the second substrate 130 without connection of wires.

Here, in the third example, the electrical connection part 140 formed on the semiconductor device 120 includes 50% or more of Au, Ag, or Cu or 50% or more of a solder material containing Sn or Pb and may electrically connect a signal connection terminal 122, which is bumped, with the lower metal pattern 135 of the second substrate 130.

The at least one semiconductor device 120 may be electrically connected with the second substrate 130 through a solder material (not illustrated) containing 50% or more of Sn or Pb. That is, the terminal pads 121 of the semiconductor devices 120 on the second pad 111*b* and the lower metal pattern 135 of the second substrate 130 are electrically connected to each other by the solder material, and an electrical signal may be applied from the lower metal pattern 135 and the upper metal pattern 134, which is electrically connected through the electrical connection parts 140 formed on the via holes 132 (refer to FIG. 9), to the semiconductor devices 120 on the second pad 111*b*.

To sum up, electrical connection between the semiconductor devices 120 and the second substrate 130 in the semiconductor packages of the first and second examples is realized in such a way that the semiconductor devices 120 on the first pad 111*a* is electrically connected with the upper metal pattern 134 of the second substrate 130 by a bonding wire passing through the penetrated opening unit 131, and the semiconductor devices 120 on the second pad 111*b* is bonded to the lower metal pattern 135 by a solder material, wherein the lower metal pattern 135 is electrically connected with the upper metal pattern 134 through the electrical connection part 140 formed on the via hole 132 so that an electrical signal may be applied from the second substrate 130 to each of the semiconductor devices 120 on the pads 111. In addition, electrical connection between the semiconductor devices 120 and the second substrate 130 in the semiconductor package of the third example is realized in such a way that the semiconductor devices 120 on the first pad 111*a* is electrically connected with the signal connection terminal 122 and the lower metal pattern 135 of the second substrate 130, and the semiconductor devices 120 on the second pad 111*b* is bonded to the lower metal pattern 135 by a solder material, wherein the lower metal pattern 135 is electrically connected with the upper metal pattern 134 through the electrical connection part 140 formed on the via hole 132 so that an electrical signal may be applied from the second substrate 130 to each of the semiconductor devices 120 on the pads 111.

The semiconductor packages of the first through third examples may be each distinguished from each other by each different combination structure between the first pad 111*a*, the semiconductor devices 120 on the first pad 111*a*, and the penetrated opening units 131 facing the semiconductor devices 120.

That is, as illustrated in FIGS. 3, 5A to 5C, and 10A, in the semiconductor package of the first example, a size of the penetrated opening unit 131 may be the same as or larger than a size of the semiconductor device 120 on the first pad 111*a*, a size of the first pad 111*a* is larger than a size of the semiconductor device 120 and larger than a size of the penetrated opening unit 131, and the semiconductor device 120 on the first pad 111*a* is electrically connected with the second substrate 130 by a bonding wire.

Also, as illustrated in FIGS. 4, 6A to 6C, and 10B, in the semiconductor package of the second example, a size of the penetrated opening unit 131 may be the same as or larger than a size of the semiconductor device 120 on the first pad 111*a*, a size of the first pad 111*a* is same as a size of the semiconductor device 120 (that is, is same as or smaller than a size of the penetrated opening unit 131), and the semiconductor device 120 on the first pad 111*a* is electrically connected with the second substrate 130 by a bonding wire.

Figure 10A:
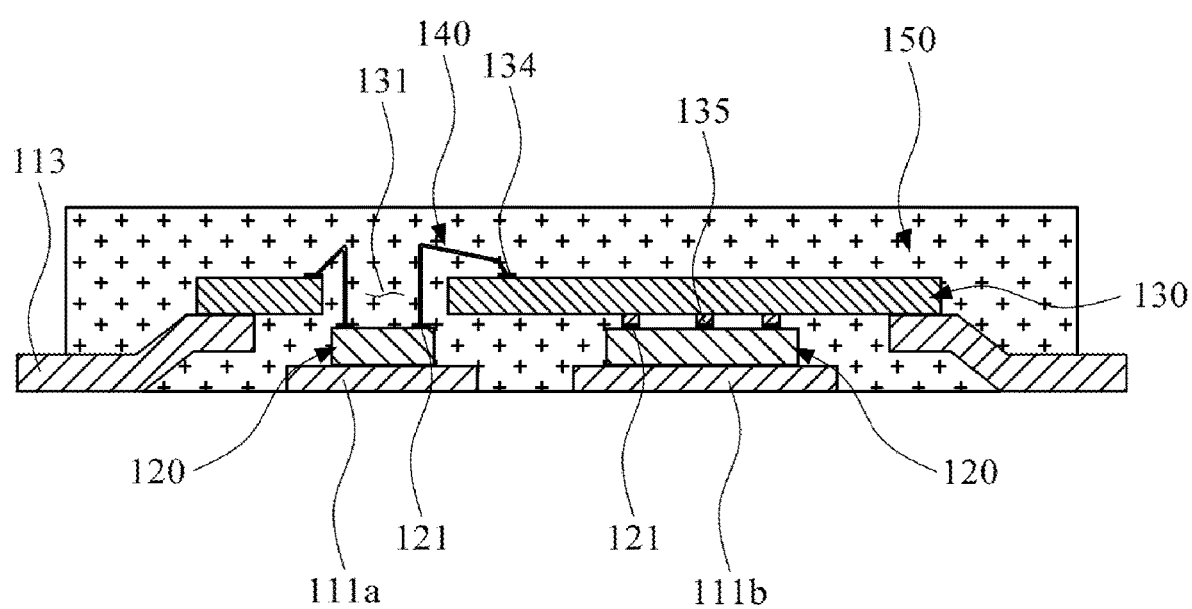
Figure 10B:
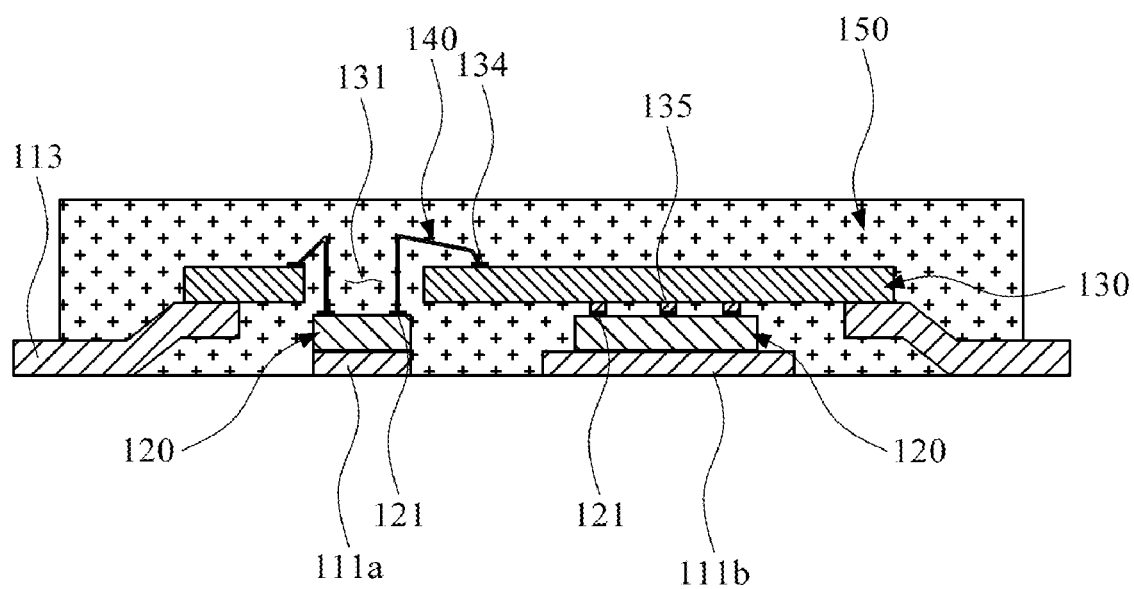
Figure 10C:
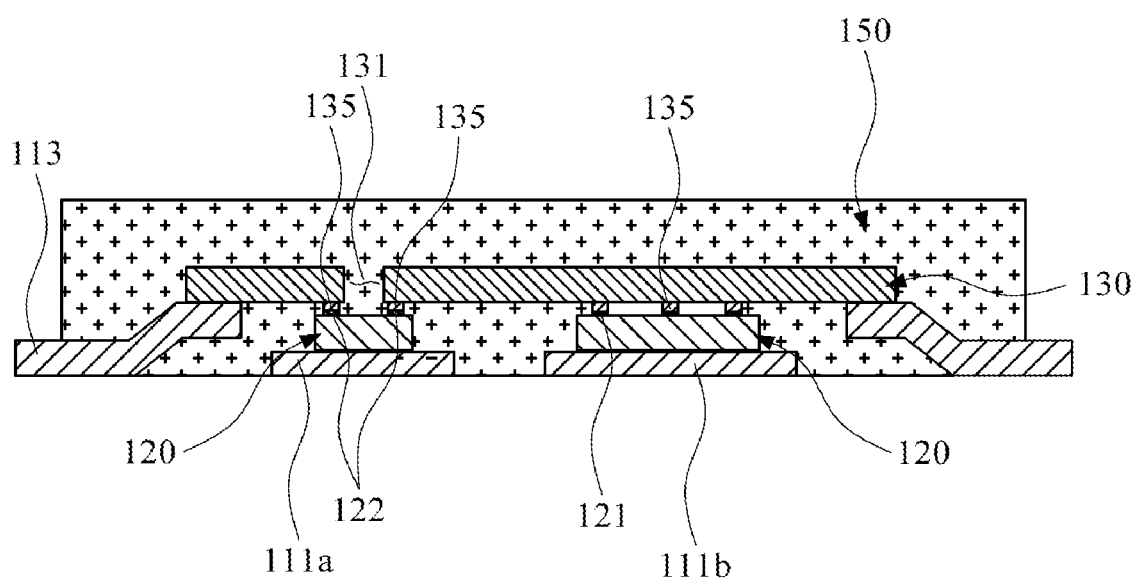

In addition, as illustrated in FIGS. 7 and 10C, in the semiconductor package of the third example, a size of the penetrated opening unit 131 is smaller than a size of the semiconductor device 120 on the first pad 111*a*, a size of the first pad 111*a* is larger than a size of the penetrated opening unit 131, and the semiconductor device 120 on the first pad 111*a* and the second substrate 130 are electrically connected to each other by directly bonding to the signal connection terminal 122 without passing through the penetrated opening unit 131.

The penetrated opening units 131 in the first and the third examples are formed to correspond to the shape of the semiconductor devices 120, and a length of at least one surface of the penetrated opening unit 131 may be shorter than a length of at least one surface of the first pad 111*a* of the first substrate 110, on which the semiconductor devices 120 are bonded.

Also, the penetrated opening units 131 in the second example are formed to correspond to the shape of the semiconductor devices 120, and a length of at least one surface of the penetrated opening unit 131 may be greater than a length of at least one surface of the first pad 111*a* of the first substrate 110, on which the semiconductor devices 120 are bonded.

Next, the package housing 150 is formed of an epoxy molding compound (EMC), which is a semiconductor sealing material, and as illustrated in FIGS. 10A to 10C, covers the semiconductor devices 120 and the electrical connection parts 140 so that an inner circuit is protected.

The lower surface of the first substrate 110 may be partially or entirely exposed to the surface of the package housing 150, wherein a part of the lower surface is the lower surface of the at least one pad 111 of the first substrate 110, and 50% or more of the entire lower surface is exposed to the surface of the package housing 150. Accordingly, a heat sink (not illustrated) may be attached to improve the heat radiation performance.

Also, the lower surface of the terminal lead part 113 of the first substrate 110 may be partially or entirely exposed to the surface of the package housing 150.

In addition, when the package housing 150 is formed, 90% or more of an EMC is to be filled in an inner space of the penetrated opening unit 131 and thereby, the electrical connection part 140 is stably molded. Accordingly, disconnection or short of the electrical connection part 140 may be prevented.

For reference, the semiconductor packages described above have efficiently optimized and designed spaces to be used in low on-resistance and high-speed switching and thereby, may be used as power semiconductor packages which are suitable for high power applications in a power electronic field.

Therefore, according to the semiconductor packages described above, the first substrate and the second substrate are formed to have a multi die stacked structure and an electrical signal is applied to the semiconductor devices through the penetrated opening units. Accordingly, the first substrate and the second substrate may be formed to be compact that is appropriate for a small-sized semiconductor package, and sizes of the penetrated opening units which face the semiconductor devices are adjusted so that a shielding performance of EMI and a heat radiation performance may be improved.

According to the present invention, the first substrate and the second substrate are formed to have a multi die stacked structure and an electrical signal is applied to the semiconductor devices through the penetrated opening units. Accordingly, the first substrate and the second substrate may be formed to be compact that is appropriate for a small-sized semiconductor package, and sizes of the penetrated opening units which face the semiconductor devices are adjusted so that a shielding performance of EMI and a heat radiation performance may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a first substrate comprising at least two pads electrically or structurally separated from each other and at least two leads spaced apart from the pads;
   at least two semiconductor devices bonded on each of the pads;
   a second substrate formed on and spaced apart from the upper parts of the semiconductor devices, placed on and electrically connected to the at least one lead of the first substrate, and comprising at least one penetrated opening unit on an area facing the at least one semiconductor device;
   electrical connection parts electrically connecting the at least one semiconductor device with the second substrate; and
   a package housing covering the semiconductor devices and the electrical connection part,
   wherein the second substrate comprises at least one insulating layer.

2. The semiconductor package of claim 1, wherein the first substrate is a lead frame formed of a metal and the metal comprises 50% or more of Cu or 40% or more of Al.

3. The semiconductor package of claim 1, wherein the at least one pad comprises at least one insulating layer and a metal layer pad where the semiconductor device is bonded on the insulating layer, and the at least one lead comprises a connection lead part electrically connected with the second substrate and a terminal lead part extended from the connection lead part.

4. The semiconductor package of claim 1, wherein the second substrate is a printed circuit board (PCB), a Direct Bonded Copper (DBC) substrate comprising a ceramic-type insulating layer, an Active Metal Brazing (AMB) substrate, or a Thick Printed Copper (TPC) substrate.

5. The semiconductor package of claim 1, wherein the second substrate comprises at least one upper metal pattern on the uppermost part thereof and at least one lower metal pattern on the lowest part thereof, and the upper metal patterns and the lower metal patterns are electrically connected to each other.

6. The semiconductor package of claim 1, wherein the diameter of the penetrated opening unit is 0.2 mm to 20.0 mm and the side of the penetrated opening unit is covered with a non-conductive material.

7. The semiconductor package of claim 1, wherein terminal pads on the at least one semiconductor device and the upper metal pattern on the second substrate are electrically connected to each other by the electrical connection part which pass the penetrated opening unit.

8. The semiconductor package of claim 7, wherein the electrical connection part is a bonding wire and the bonding wire comprises 50% or more of any one of Cu, Au, and Al.

9. The semiconductor package of claim 7, wherein the most outer surface of the upper metal pattern on the second substrate entirely or partially comprises 50% or more of Au, Ag, or Cu.

10. The semiconductor package of claim 1, wherein the terminal pads on the at least one semiconductor device and the lower metal pattern on the second substrate formed outside of the penetrated opening unit are electrically connected to each other by the electrical connection part.

11. The semiconductor package of claim 10, wherein the electrical connection part formed on the semiconductor device comprises 50% or more of Au, Ag, Cu or a solder material and electrically connects a signal connection terminal, which is bumped, with the lower metal pattern on the second substrate.

12. The semiconductor package of claim 1, wherein the at least one semiconductor device is electrically connected with the second substrate by a solder material containing 50% or more of Sn or Pb.

13. The semiconductor package of claim 1, wherein a size of the penetrated opening unit is the same as or larger than a size of the semiconductor device.

14. The semiconductor package of claim 1, wherein a size of the penetrated opening unit is smaller than a size of the semiconductor device.

15. The semiconductor package of claim 1, wherein the penetrated opening unit is formed to correspond to the shape of the semiconductor device, and a length of at least one surface of the penetrated opening unit is greater than a length of at least one surface of the pad of the first substrate, on which the semiconductor devices are bonded.

16. The semiconductor package of claim 1, wherein the penetrated opening unit is formed to correspond to the shape of the semiconductor device, and a length of at least one surface of the penetrated opening unit is shorter than a length of at least one surface of the pad of the first substrate, on which the semiconductor devices are bonded.

17. The semiconductor package of claim 1, wherein the upper metal pattern or the lower metal pattern on the second substrate is electrically connected with the at least one lead of the first substrate by using a conductive adhesive.

18. The semiconductor package of claim 1, wherein the at least one lead comprises the connection lead part electrically connected with the second substrate and the terminal lead part extended from the connection lead part, and the connection lead part of the first substrate electrically connected with the second substrate is formed to be placed above the terminal lead part of the first substrate exposed to the outside of the package housing.

19. The semiconductor package of claim 1, wherein the lower surface of the first substrate is entirely or partially exposed to the surface of the package housing.

20. The semiconductor package of claim 1, wherein 90% or more of a material forming the package housing is filled in an inner space of the penetrated opening unit.

\* \* \* \* \*